United States Patent
Hu et al.

(10) Patent No.: US 10,629,745 B2
(45) Date of Patent: Apr. 21, 2020

(54) MANUFACTURING METHOD AND STRUCTURE OF OXIDE THIN FILM TRANSISTOR

(71) Applicant: Shenzhen China Star Optoelectronics Technology Co., Ltd., Shenzhen, Guangdong (CN)

(72) Inventors: Yutong Hu, Guangdong (CN); Chihyuan Tseng, Guangdong (CN); Chihyu Su, Guangdong (CN); Wenhui Li, Guangdong (CN); Xiaowen Lv, Guangdong (CN); Longqiang Shi, Guangdong (CN); Hejing Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 227 days.

(21) Appl. No.: 14/384,447

(22) PCT Filed: Jul. 14, 2014

(86) PCT No.: PCT/CN2014/082126
§ 371 (c)(1),
(2) Date: Sep. 11, 2014

(87) PCT Pub. No.: WO2015/192418
PCT Pub. Date: Dec. 23, 2015

(65) Prior Publication Data
US 2016/0240687 A1    Aug. 18, 2016

(30) Foreign Application Priority Data

Jun. 19, 2014 (CN) .......................... 2014 1 0277587

(51) Int. Cl.
*H01L 29/786* (2006.01)
*H01L 29/06* (2006.01)
(Continued)

(52) U.S. Cl.
CPC ...... *H01L 29/78606* (2013.01); *H01L 27/127* (2013.01); *H01L 27/1225* (2013.01);
(Continued)

(58) Field of Classification Search
CPC .......... H01L 29/78606; H01L 27/1225; H01L 27/127; H01L 29/66969; H01L 29/7869;
(Continued)

(56) References Cited

U.S. PATENT DOCUMENTS

2009/0256147 A1* 10/2009 Kim .................... H01L 29/7869
                                                        257/43
2009/0261355 A1* 10/2009 Matsukizono .......... H01L 29/06
                                                        257/88
(Continued)

*Primary Examiner* — Hoang-Quan Ho
(74) *Attorney, Agent, or Firm* — Andrew C. Cheng

(57) ABSTRACT

The present invention provides a manufacture method and a structure of an oxide thin film transistor. The manufacture method of the structure of the oxide thin film transistor comprises providing a carrier; forming an oxide semiconducting layer (4); forming an etching stopper layer (5); forming two vias (51, 53) in the etching stopper layer (5) to expose the oxide semiconducting layer (4); removing a skin layer of the oxide semiconducting layer (4) in the two vias (51, 53) to form two recesses (41, 43) respectively connecting the two vias (51, 53); forming a source (61) and a drain (63) on the etching stopper layer (5), and the source (61) fills one via (51) and the recess (41) connecting therewith, and the drain (63) fills the other via (53) and the recess (43) connecting therewith; performing a post process.

7 Claims, 8 Drawing Sheets

(51) Int. Cl.
*H01L 27/12* (2006.01)
*H01L 29/66* (2006.01)

(52) U.S. Cl.
CPC ........ *H01L 29/06* (2013.01); *H01L 29/66969* (2013.01); *H01L 29/786* (2013.01); *H01L 29/7869* (2013.01); *H01L 29/78696* (2013.01)

(58) Field of Classification Search
CPC .. H01L 29/78696; H01L 29/06; H01L 29/786
See application file for complete search history.

(56) References Cited

U.S. PATENT DOCUMENTS

| | | | |
|---|---|---|---|
| 2011/0068337 A1* | 3/2011 | Choi | H01L 29/78606 257/43 |
| 2013/0092944 A1* | 4/2013 | Honda | H01L 21/02554 257/57 |
| 2014/0239290 A1* | 8/2014 | Kim | H01L 29/7869 257/43 |
| 2014/0307194 A1* | 10/2014 | Suzumura | H01L 29/78693 349/43 |
| 2015/0001534 A1* | 1/2015 | Chang | H01L 29/66969 257/43 |
| 2015/0076488 A1* | 3/2015 | Kishi | H01L 29/7869 257/43 |
| 2016/0079437 A1* | 3/2016 | Ochi | H01L 29/7869 257/43 |

* cited by examiner

MANUFACTURING METHOD AND STRUCTURE OF OXIDE THIN FILM TRANSISTOR

FIELD OF THE INVENTION

The present invention relates to a skill field of a flat panel display, and more particularly to a manufacture method and a structure of a thin film transistor backplane.

BACKGROUND OF THE INVENTION

A thin film transistor (TFT) has been widely utilized as a switching element and a driving element in an electronic device. Specifically, due to the possibility of formation of the thin film transistors on a glass substrate or a plastic substrate, they are commonly employed in the flat panel display field, such as a liquid crystal display (LCD), an organic light emitting diode (OLED), and etc.

The oxide semiconductor has higher electron mobility (the mobility of the oxide semiconductor is >10 cm$^2$/Vs and the mobility of the amorphous silicon (a-Si) is merely 0.5~0.8 cm$^2$/Vs) and has simpler manufacture process in comparison with the Low Temperature Poly-silicon (LTPS) and higher compatibility in comparison with the amorphous silicon process. Therefore, it can be applicable to the skill fields of Liquid Crystal Display, Organic Light Emitting Display, Flexible Display and etc. Because it fits the new generation production lines and the possible applications in displays with Large, Middle and Small sizes. The oxide semiconductor is hot to the research field of the present industry because the great opportunity of application development.

The oxide semiconductor has advantages of higher electron mobility and simpler manufacture process. Nevertheless, some drawbacks exist. As illustrations, the stability is bad and big influence with temperature and humidity exists. The electric property of the oxide semiconductor drifts with time. The oxide semiconductor requires higher demands for process conditions, such as the film formation rate, the atmosphere and the temperature of the process, control of the temperature and etc. Besides, higher demands are further required for the isolation layer, the contact between the oxide semiconducting layer and the isolation layer, the contact between the oxide semiconducting layer and the metal layer. Restrict demanding the oxide semiconducting layer itself is not enough as regarding an oxide thin film transistor.

Please refer to FIG. 1, which is a sectional view diagram of a structure of a bottom gate type oxide thin film transistor according to prior art. The manufacture method of the structure of the oxide thin film transistor mainly comprises: step 1, providing a substrate (100); step 2, forming a gate (200) on the substrate (100); step 3, covering the gate (200) with a gate isolated layer (300); step 4, forming an oxide semiconducting layer (400) on the gate isolated layer (300); step 5, forming an etching stopper layer (500) on the oxide semiconducting layer (400); step 6, respectively forming two vias (510, 530) in the etching stopper layer (500) to expose the oxide semiconducting layer (400); step 7, forming a source (610) and a drain (630) on the etching stopper layer (500), and the source (610) fills one via (510) and connects with the oxide semiconducting layer (400), the drain (630) fills the other via (530) and connects with the oxide semiconducting layer (400); step 8, forming a protective layer (700) on the source (610) and the drain (630) for covering the source (610) and the drain (630).

In the aforementioned manufacture method of the structure of the oxide thin film transistor, the etching stopper layer (500) of step 5 is generally formed by a SiOx film layer which is manufactured with TEOS+O2 or SiH4+N2O chemical vapor deposition. However, the plasma will affect the surface property of the oxide semiconducting layer (400) when the film of the etching stopper layer (500) is formed. For instance, SiH4+N2O contains hydrogen which may combines with the oxygen in the oxide semiconducting layer (400) and leads into increase of the oxygen defects. As a result, the threshold voltage Vth tends to be negative. The oxygen in TEOS+O2 leads into decrease of the oxygen defects in the oxide semiconducting layer (400) and reduces the conductivity of the trench. Therefore, what contacts with the source (610) and the drain (630) is the damaged surface of the oxide semiconducting layer (400). Ultimately, the electrical property of the oxide thin film transistor is affected. Please refer to FIG. 2, which is a curve diagram of the electrical property of an oxide thin film transistor according to prior art. As shown in the figure, the threshold voltage Vth=−5V and subthreshold swing S.S=0.45 when the voltage of the drain Vd=10V. The electrical property of the oxide thin film transistor can be worse.

SUMMARY OF THE INVENTION

An objective of the present invention is to provide a manufacture method of a structure of an oxide thin film transistor. By using the manufacture method, a source and a drain can contact an oxide semiconducting layer which is not damaged and remains the original property. The oxide thin film transistor formed by the manufacture method possesses more stable and more excellent electrical property.

Another objective of the present invention is to provide a structure of oxide thin film transistor which possesses fine electrical property and promote the quality of the oxide thin film transistor.

For realizing the aforesaid objective, the present invention provides a manufacture method of a structure of an oxide thin film transistor, comprising steps of:

step 1, providing a carrier;

step 2, forming an oxide semiconducting layer on the carrier;

step 3, forming an etching stopper layer on the oxide semiconducting layer;

step 4, forming two vias in the etching stopper layer to expose the oxide semiconducting layer;

step 5, removing a skin layer of the oxide semiconducting layer in the two vias to form two recesses respectively connecting the two vias;

step 6, forming a source and a drain on the etching stopper layer, and the source fills one via and the recess connecting therewith to connect to the oxide semiconducting layer, and the drain fills the other via and the recess connecting therewith to connect to the oxide semiconducting layer.

The etching stopper layer is formed on the oxide semiconducting layer by chemical vapor deposition; the two vias are formed in the etching stopper layer by dry etching; the source and the drain are formed on the etching stopper layer by sputtering; the skin layer of the oxide semiconducting layer in the two vias are removed by dry etching or wet etching.

The etching stopper layer is a SiOx film layer formed by TEOS+O2 or SiH4+N2O chemical vapor deposition.

The carrier comprises a substrate, a gate formed on the substrate and a gate isolated layer formed on the substrate and the gate.

The manufacture method of the structure of the oxide thin film transistor further comprises a step 7 of performing a post process, and the post process comprises forming a protective layer on the source and the drain to cover the source and the drain.

The carrier is a substrate.

The manufacture method of the structure of the oxide thin film transistor further comprises a step 7 of performing a post process, and the post process comprises forming a gate isolated layer on the source and the drain, and sputtering a gate on the gate isolated layer.

The present invention further provides a structure of oxide thin film transistor, comprising: an oxide semiconducting layer, an etching stopper layer on the oxide semiconducting layer, and a source and a drain on the etching stopper layer, and two vias are formed in the etching stopper layer, and the oxide semiconducting layer comprises two recesses respectively corresponding to the two vias and the two recesses respectively connect with the two vias, and the source fills one via and the recess connecting therewith to connect to the oxide semiconducting layer, and the drain fills the other via and the recess connecting therewith to connect to the oxide semiconducting layer.

The structure of the oxide thin film transistor further comprises a substrate, a gate on the substrate, a gate isolated layer on the substrate and the gate, and a protective layer on the source and the drain; the oxide semiconducting layer is located on the gate isolated layer.

The structure of the oxide thin film transistor further comprises a substrate, a gate isolated layer on the source and the drain, and a gate on the gate isolated layer; the oxide semiconducting layer is located on the substrate.

The present invention further provides a structure of an oxide thin film transistor, comprising: an oxide semiconducting layer, an etching stopper layer on the oxide semiconducting layer, and a source and a drain on the etching stopper layer, and two vias are formed in the etching stopper layer, and the oxide semiconducting layer comprises two recesses respectively corresponding to the two vias and the two recesses respectively connect with the two vias, and the source fills one via and the recess connecting therewith to connect to the oxide semiconducting layer, and the drain fills the other via and the recess connecting therewith to connect to the oxide semiconducting layer; and the structure of the oxide thin film transistor further comprises a substrate, a gate on the substrate, a gate isolated layer on the substrate and the gate, and a protective layer on the source and the drain; the oxide semiconducting layer is located on the gate isolated layer.

The benefits of the present invention are: in the manufacture method of a structure of an oxide thin film transistor according to the present invention, by performing dry etching or wet etching to a skin layer of an oxide semiconducting layer exposed in two vias, the skin layer of the oxide semiconducting layer, which the property is changed due to the damage of O and H of the plasma when the etching stopper layer is formed is removed, the source and the drain can contact the oxide semiconducting layer which is not damaged and remains the original property. The oxide thin film transistor formed by the manufacture method possesses more stable and more excellent electrical property and the method is simple for operation. In the structure of the oxide thin film transistor according to the present invention, by locating two recesses in the oxide semiconducting layer corresponding to the two vias in the etching stopper layer, and the two recesses respectively connect with the two vias to allow the source and the drain contact the oxide semiconducting layer which remains the original property. Accordingly, fine electrical property is achievable and the quality of the oxide thin film transistor can be promoted.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

Figure 1:
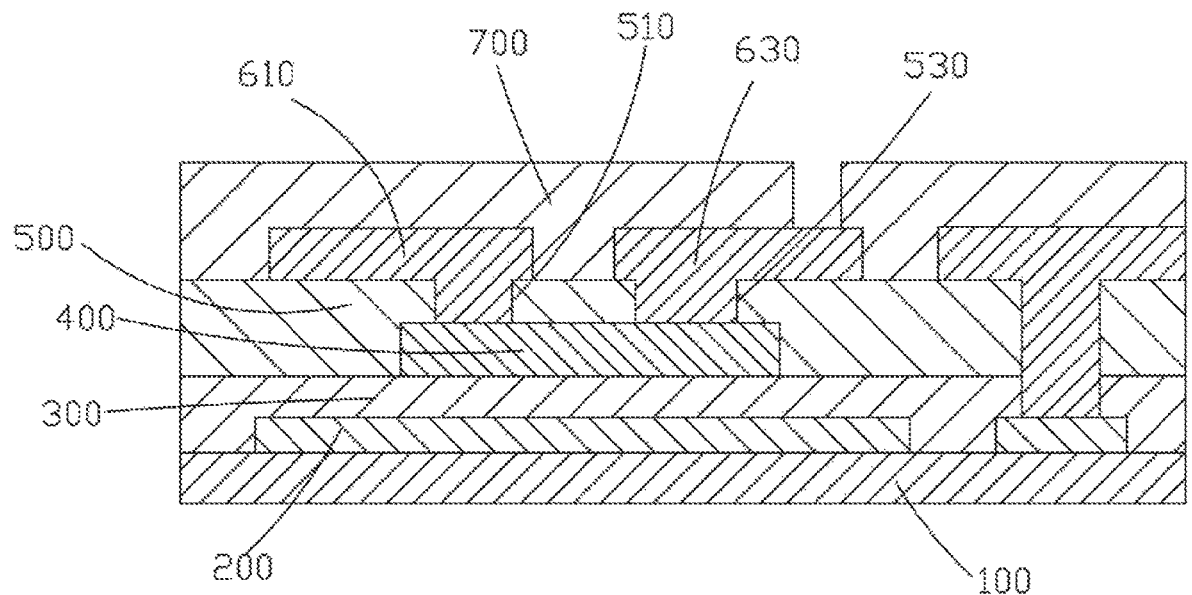
FIG. 1 is a sectional view diagram of a structure of an oxide thin film transistor according to prior art.
Figure 2:
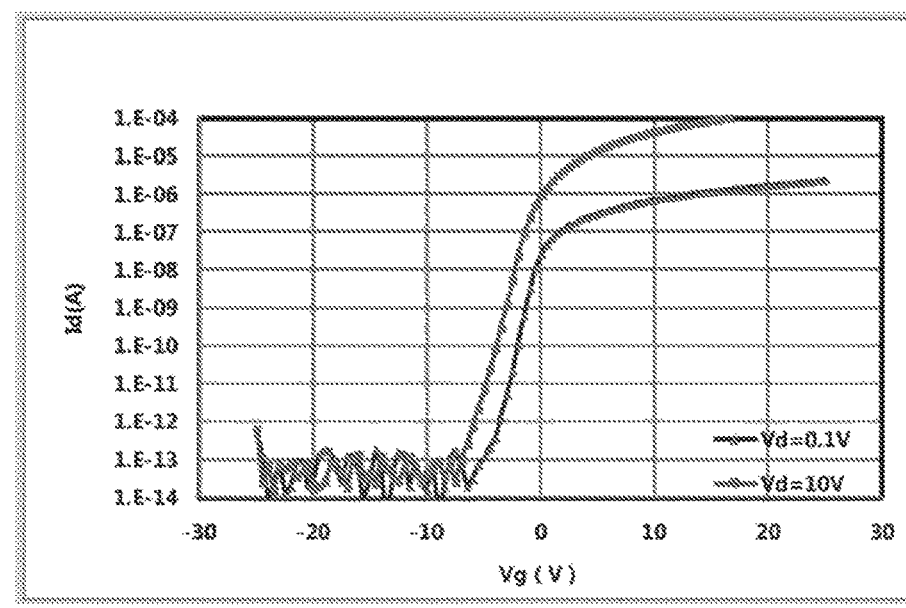
FIG. 2 is a curve diagram of the electrical property of an oxide thin film transistor according to prior art.
Figure 3:
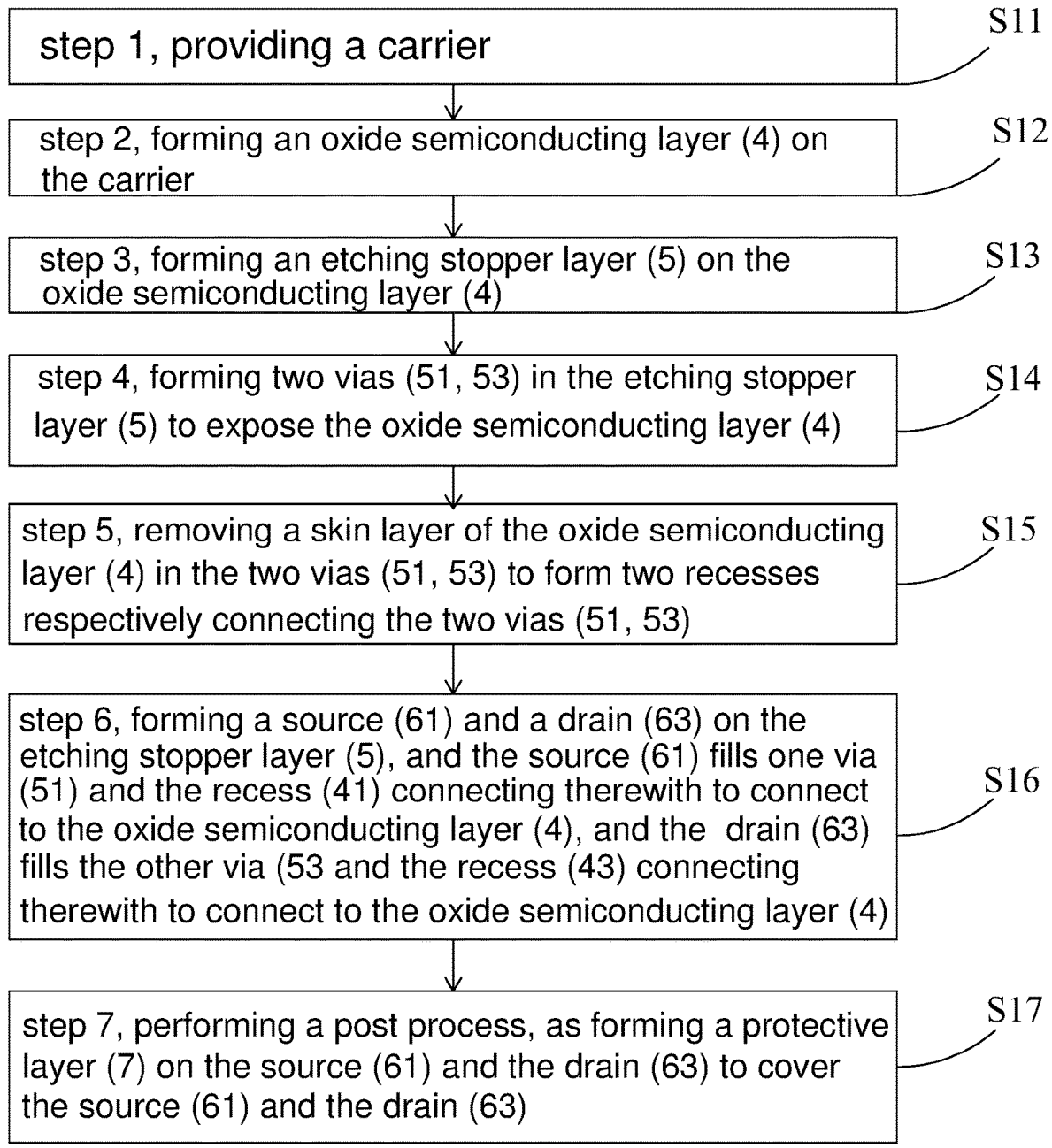
FIG. 3 is a flowchart of a manufacture method of a structure of an oxide thin film transistor according to the first embodiment of the present invention.
Figure 4:
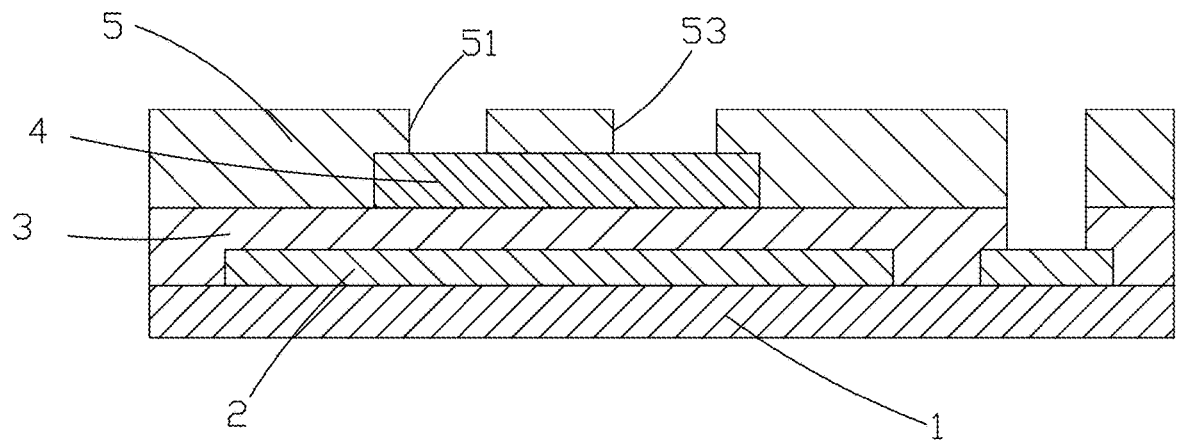
FIG. 4 is a diagram of step S14 of the first embodiment of the manufacture method of the structure of the oxide thin film transistor according to the present invention.
Figure 5:
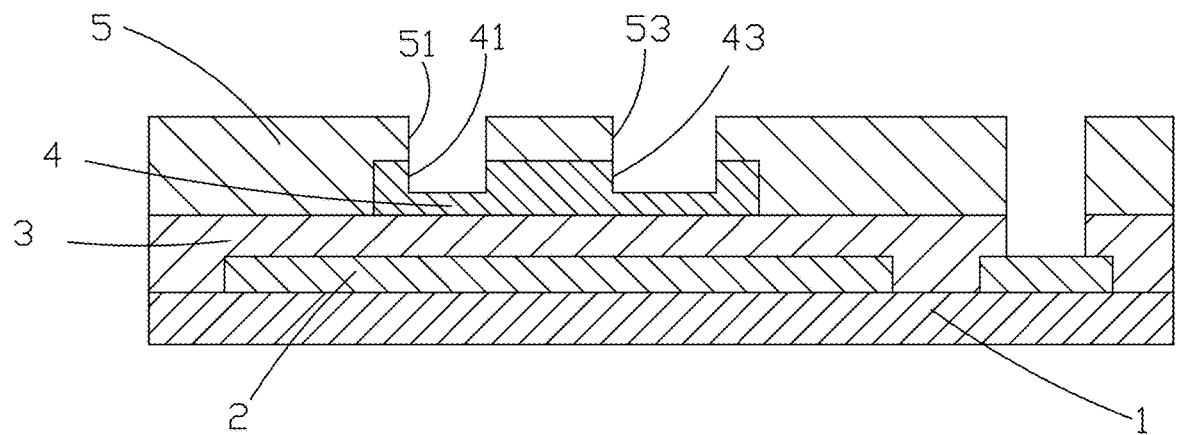
FIG. 5 is a diagram of step S15 of the first embodiment of the manufacture method of the structure of the oxide thin film transistor according to the present invention.
Figure 6:
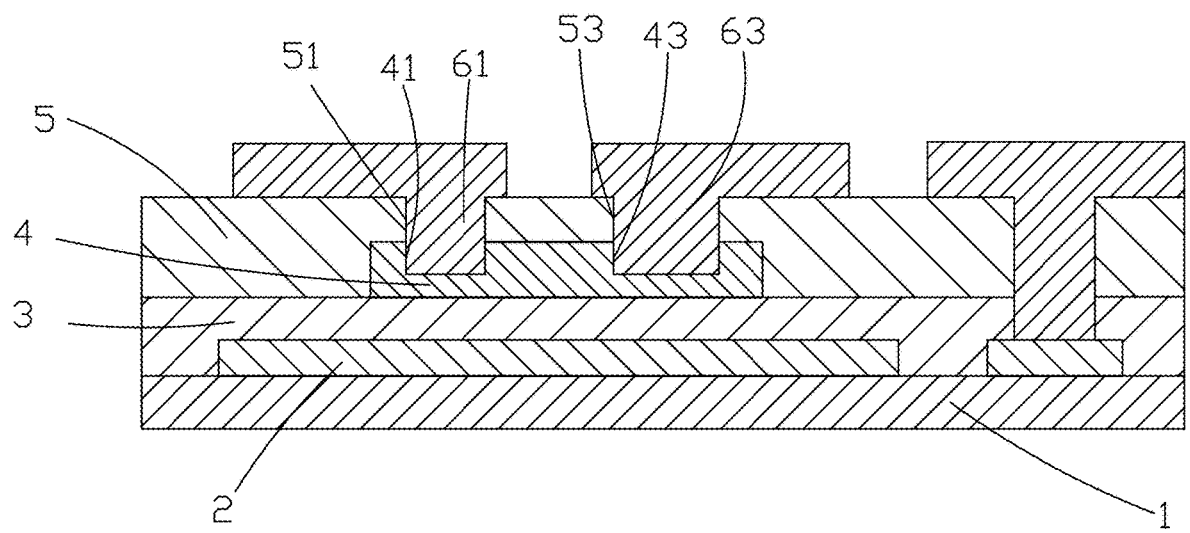
FIG. 6 is a diagram of step S16 of the first embodiment of the manufacture method of the structure of the oxide thin film transistor according to the present invention.

Embodiments of the present invention are described in detail with the technical matters, structural features, achieved objects, and effects with reference to the accompanying drawings as follows.

Please refer from FIG. 3 to FIG. 7, which are the first embodiment of the manufacture method of the structure of the oxide thin film transistor according to the present invention. The first embodiment is applicable to a bottom gate type thin film transistor. The manufacture method comprises:

step S11, providing a carrier.

In the first embodiment, the carrier comprises a substrate 1, a gate 2 formed on the substrate 1 and a gate isolated layer 3 formed on the substrate 1 and the gate 2. Preferably, the substrate 1 is a glass substrate.

step S12, forming an oxide semiconducting layer 4 on the carrier.

Preferably, a material of the oxide semiconducting layer 4 is indium gallium zinc oxide semiconducting (IGZO).

step S13, forming an etching stopper layer 5 on the oxide semiconducting layer 4.

The etching stopper layer 5 is formed on the oxide semiconducting layer 4 by chemical vapor deposition. Furthermore, the etching stopper layer 5 is a SiOx film layer formed by TEOS+O2 or SiH4+N2O chemical vapor deposition.

step S14, forming two vias 51, 53 in the etching stopper layer 5 to expose the oxide semiconducting layer 4.

In step S14, the two vias 51, 53 are formed in the etching stopper layer 5 by dry etching.

step S15, removing a skin layer of the oxide semiconducting layer 4 in the two vias 51, 53 to form two recesses respectively connecting the two vias 51, 53.

In step S15, the skin layer of the oxide semiconducting layer 4 in the two vias 51, 53 are removed by dry etching or wet etching.

In the formation process of the etching stopper layer 5, the skin layer of the oxide semiconducting layer 4 suffers with the damage of O and H of the plasma and results in that the property of the skin layer of the oxide semiconducting layer 4 has been changed. With step S15, the skin layer of the oxide semiconducting layer 4, which the property is changed due to the damage of O and H of the plasma is removed. The new formed skin layer of the oxide semiconducting layer 4 respectively in the recesses 41, 43 connecting with the two vias 51, 53 is undamaged and possesses the original property of the oxide semiconducting layer 4.

step S16, forming a source 61 and a drain 63 on the etching stopper layer 5, and the source 61 fills one via 51 and the recess 41 connecting therewith to connect to the oxide semiconducting layer 4, and the drain 63 fills the other via 53 and the recess 43 connecting therewith to connect to the oxide semiconducting layer 4.

Specifically, the source 61 and the drain 63 are formed on the etching stopper layer 5 by sputtering.

The source 61 and the drain 63 contact the oxide semiconducting layer 4 which remains the original property because the skin layer of the oxide semiconducting layer 4 in the recesses 41, 43 is not damaged and remains the original property.

step S17, performing a post process, as forming a protective layer 7 on the source 61 and the drain 63 to cover the source 61 and the drain 63.

Figure 8:
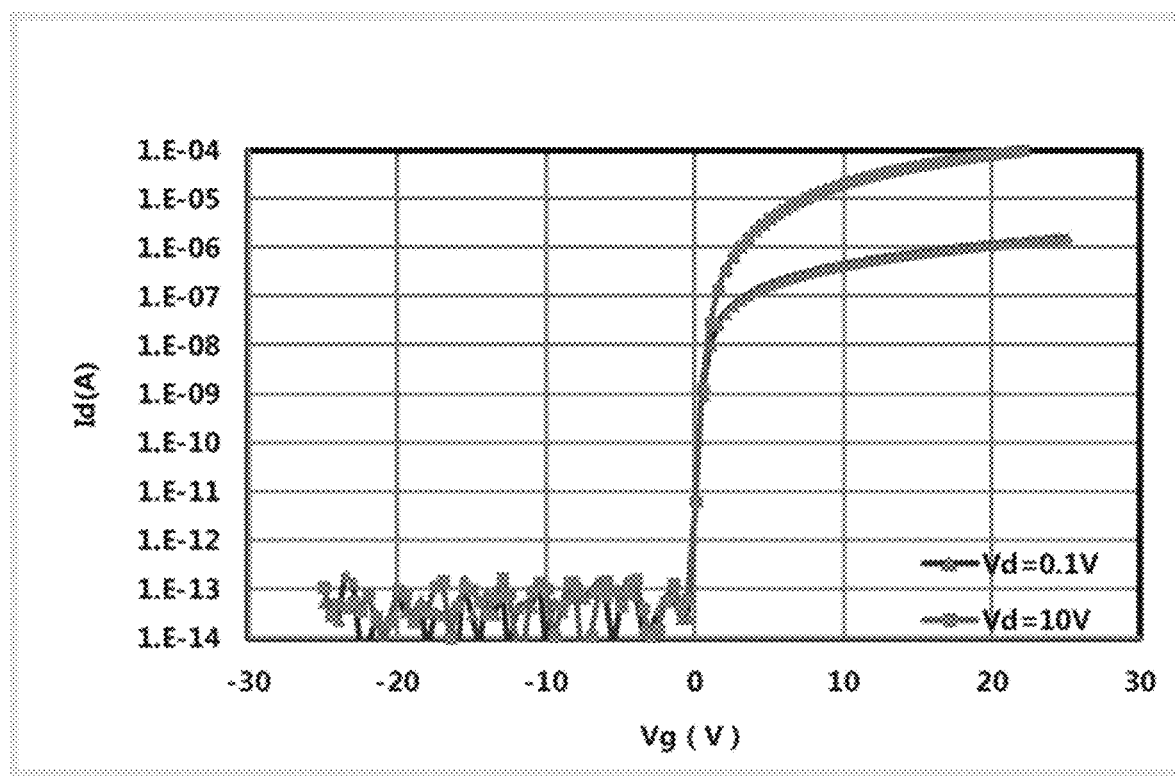
FIG. 8 is a curve diagram of the electrical property of an oxide thin film transistor according to the present invention.
Figure 9:
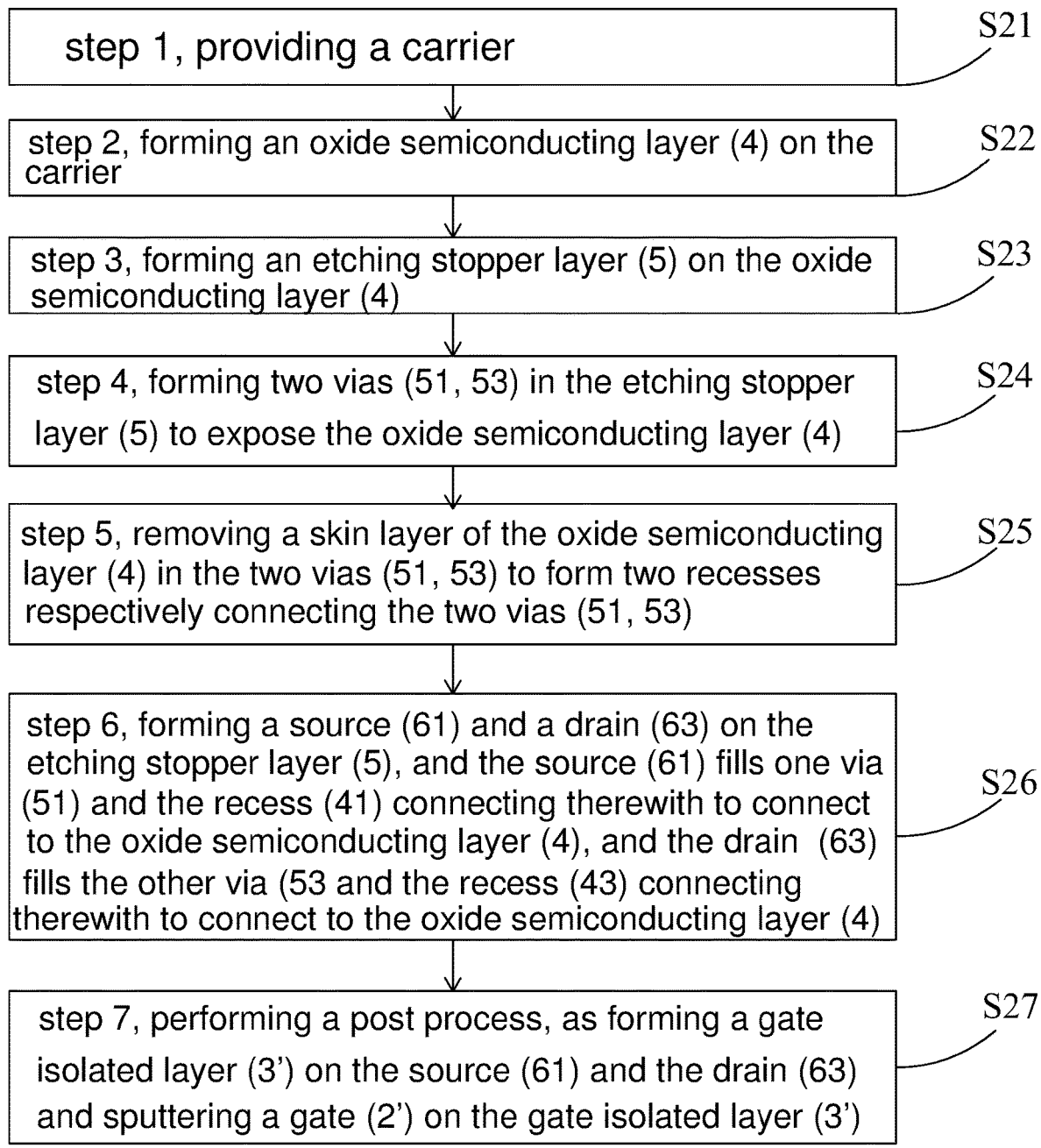
FIG. 9 is a flowchart of a manufacture method of a structure of an oxide thin film transistor according to the second embodiment of the present invention.
Figure 10:
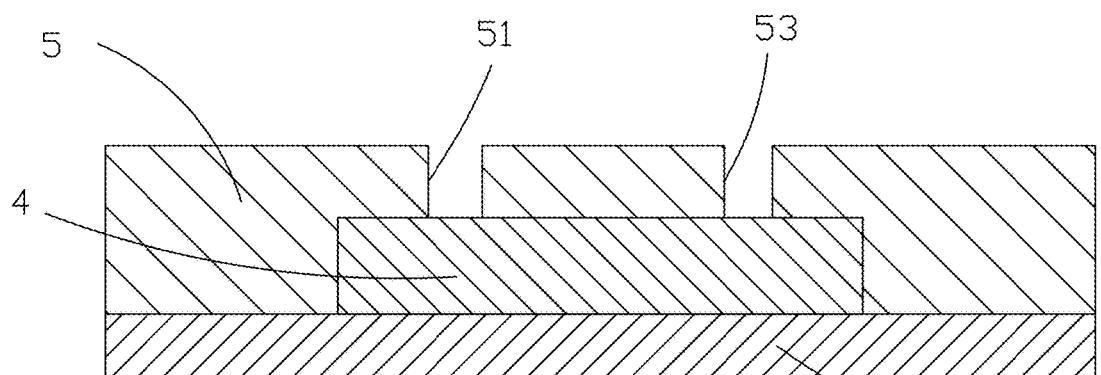
FIG. 10 is a diagram of step S23 of the second embodiment of the manufacture method of the structure of the oxide thin film transistor according to the present invention.
Figure 11:
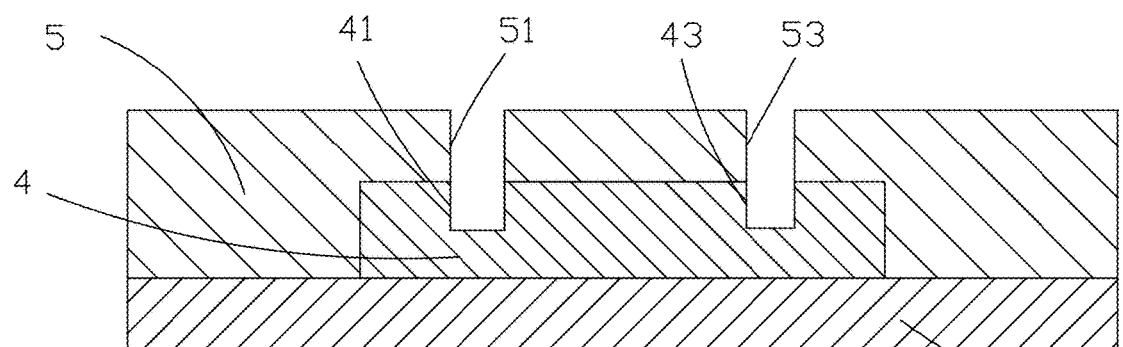
FIG. 11 is a diagram of step S24 of the second embodiment of the manufacture method of the structure of the oxide thin film transistor according to the present invention.
Figure 12:
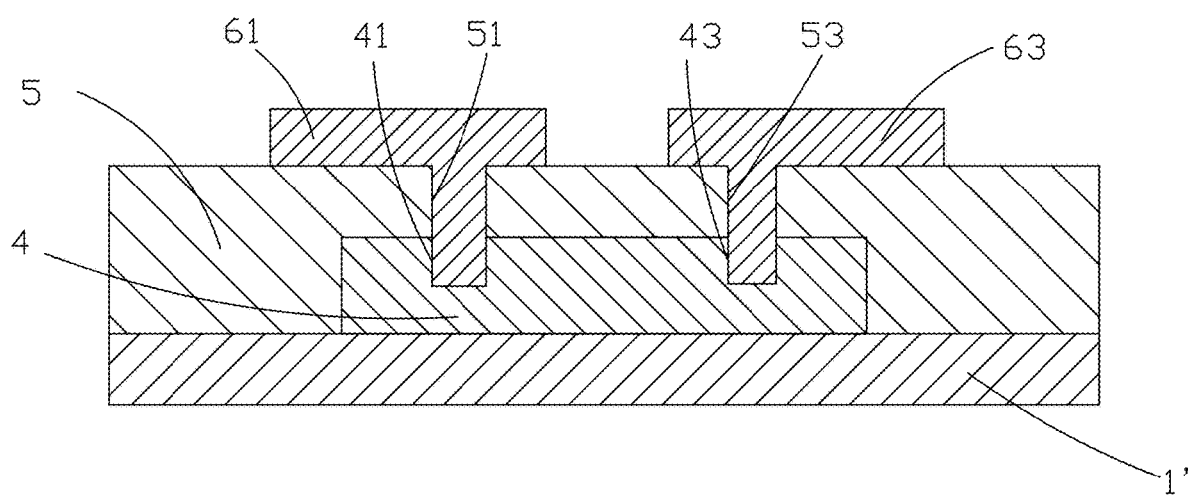
FIG. 12 is a diagram of step S25 of the second embodiment of the manufacture method of the structure of the oxide thin film transistor according to the present invention.
Figure 13:
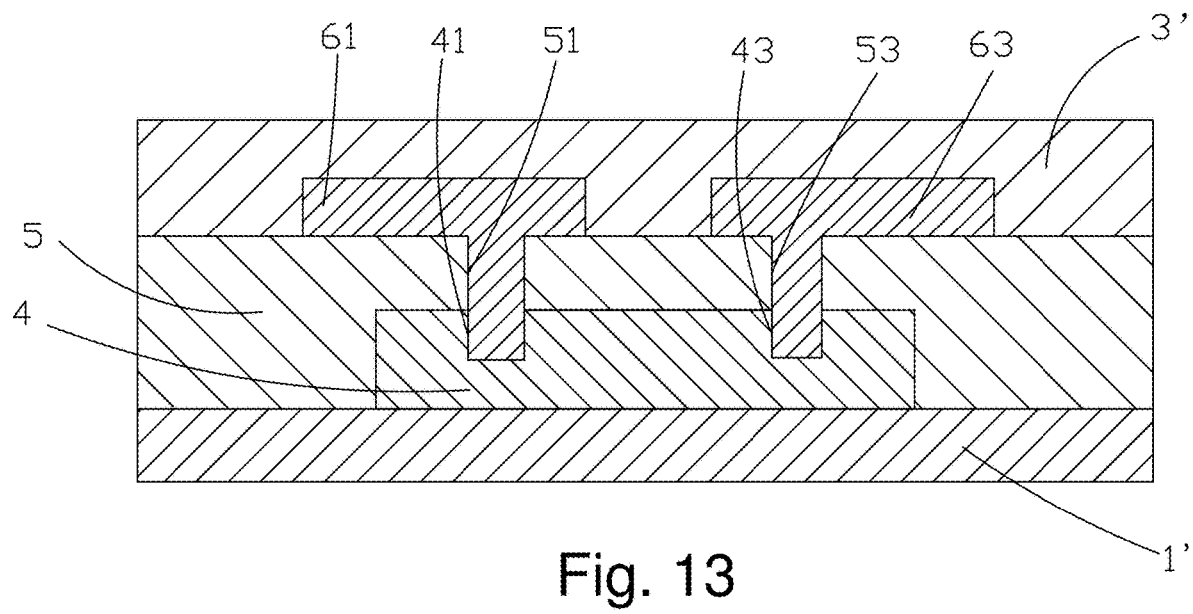
FIG. 13 is a diagram of step S26 of the second embodiment of the manufacture method of the structure of the oxide thin film transistor according to the present invention.

Please refer to FIG. 8, which is a curve diagram of the electrical property of an oxide thin film transistor formed by the aforesaid manufacture method of the structure of the oxide thin film transistor. As shown in the figure, the threshold voltage Vth=0.2V and subthreshold swing S.S=0.13 as the voltage of the drain Vd=10V. The subthreshold swing S.S becomes smaller as the threshold voltage Vth is near around the 0V. The electrical property of the oxide thin film transistor formed by the manufacture method of the structure of the oxide thin film transistor according to the present invention gets considerable and significant improvement.

Please refer from FIG. 9 to FIG. 14, which are the second embodiment of the manufacture method of the structure of the oxide thin film transistor according to the present invention. The second embodiment is applicable to a top gate type thin film transistor. The differences of the second embodiment from the first embodiment are:

step S21, providing a carrier.

In the second embodiment, the carrier is a substrate 1'. The substrate 1' is a transparent substrate. Preferably, the substrate 1' is a glass substrate.

step S27, performing a post process, as forming a gate isolated layer 3' on the source 61 and the drain 63 and sputtering a gate 2' on the gate isolated layer 3'.

The remaining steps, steps S22-S26, which are carried sequentially after step S21 and before step S27 are the same as the counterpart steps, steps S12-S16, of the first embodiment. Repeated description of these steps will not be necessary herein.

Under the foundation of a manufacture method of a structure of an oxide thin film transistor, the present further provides a structure of an oxide thin film transistor, which is applicable to a LCD apparatus or a OLED apparatus.

Figure 7:
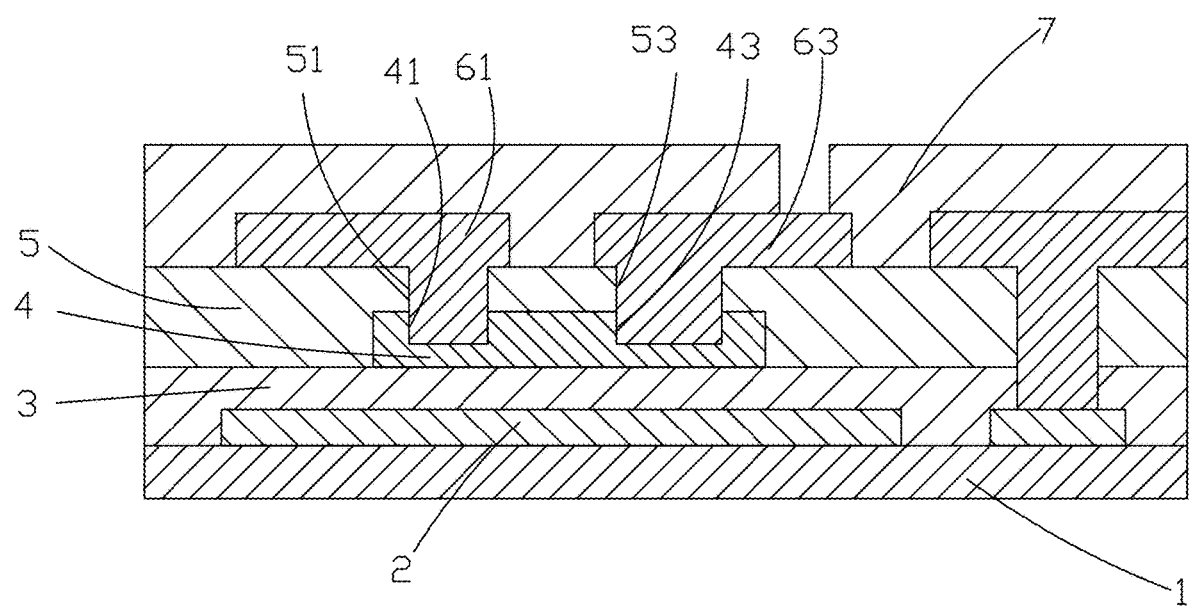
FIG. 7 is a diagram of step S17 of the first embodiment of the manufacture method of the structure of the oxide thin film transistor according to the present invention, which is also a sectional diagram of the first embodiment of the structure of the oxide thin film transistor according to the present invention.

Please refer to FIG. 7, which is a sectional diagram of the first embodiment of the structure of the oxide thin film transistor according to the present invention. In the first embodiment, the structure of the oxide thin film transistor belonging to a bottom gate type, comprises an oxide semiconducting layer 4, an etching stopper layer 5 on the oxide semiconducting layer 4, and a source 61 and a drain 63 on the etching stopper layer 5, and two vias 51, 53 are formed in the etching stopper layer 5, and the oxide semiconducting layer 4 comprises two recesses 41, 43 respectively corresponding to the two vias 51, 53 and the two recesses 41, 43 respectively connect with the two vias 51, 53, and the source 61 fills one via 51 and the recess 41 connecting therewith to connect to the oxide semiconducting layer 4, and the drain 63 fills the other via 53 and the recess 43 connecting therewith to connect to the oxide semiconducting layer 4. The structure of the oxide thin film transistor further comprises a substrate 1, a gate 2 on the substrate 1, a gate isolated layer 3 on the substrate 1 and the gate 2, and a protective layer 7 on the source 61 and the drain 63; the oxide semiconducting layer 4 is located on the gate isolated layer 3. Significantly, the two recesses 41, 43 allow the source 61v and the drain 63 contact the oxide semiconducting layer 4 which remains the original property. Therefore, fine electrical property can be achieved.

Figure 14:
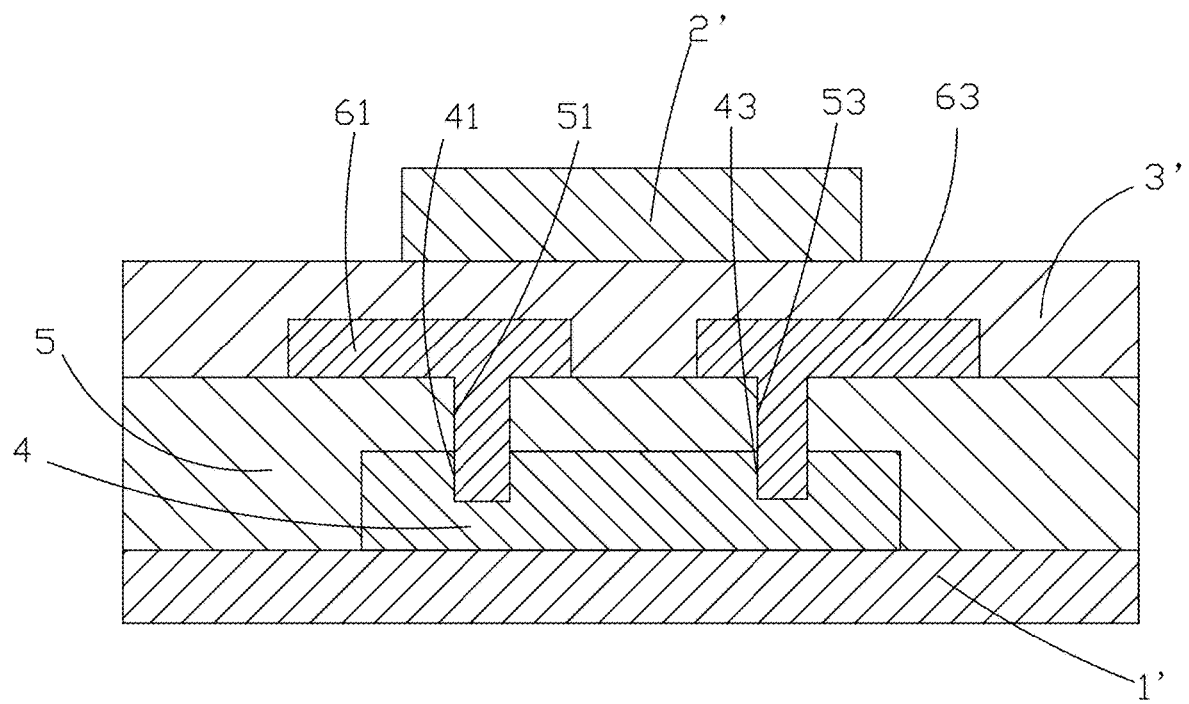
FIG. 14 is a diagram of step S27 of the second embodiment of the manufacture method of the structure of the oxide thin film transistor according to the present invention, which is also a sectional diagram of the second embodiment of the structure of the oxide thin film transistor according to the present invention.

Please refer to FIG. 14, which is a sectional diagram of the second embodiment of the structure of the oxide thin film transistor according to the present invention. In the second embodiment, the structure of the oxide thin film transistor belonging to a top gate type. The differences of the second embodiment from the first embodiment are, that it further comprises a substrate 1', a gate isolated layer 3' on the source and the drain, and a gate 2' on the gate isolated layer 3'; the oxide semiconducting layer 4 is located on the substrate 1'. Other structures are the same as described in the first embodiment. The repeated explanation is omitted here.

In conclusion, in the manufacture method of a structure of an oxide thin film transistor according to the present invention, by performing dry etching or wet etching to a skin layer of an oxide semiconducting layer exposed in two vias, the skin layer of the oxide semiconducting layer, which the property is changed due to the damage of O and H of the plasma when the etching stopper layer is formed is removed, the source and the drain can contact the oxide semiconducting layer which is not damaged and remains the original property. The oxide thin film transistor formed by the manufacture method possesses more stable and more excellent electrical property and the method is simple for operation. In the structure of the oxide thin film transistor according to the present invention, by locating two recesses in the oxide semiconducting layer corresponding to the two vias in the etching stopper layer, and the two recesses respectively connect with the two vias to allow the source and the drain contact the oxide semiconducting layer which remains the original property. Accordingly, fine electrical property is achievable and the quality of the oxide thin film transistor can be promoted.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a structure of an oxide thin film transistor, comprising steps of:

step 1, providing a carrier;

step 2, forming a single oxide semiconducting layer on the carrier, wherein the oxide semiconductor layer has a body exhibiting a predetermined original material property and has a skin layer as a unitary part of the body and defining a surface having similarly the predetermined material property;

step 3, forming an etching stopper layer on the surface of the oxide semiconducting layer, wherein the surface of the oxide semiconducting layer is affected by the formation of the etching stopper layer such that the predetermined original material property of the skin layer of the body of the oxide semiconducting layer on the surface changes to a modified material property that is different from the predetermined material property;

step 4, forming two vias in the etching stopper layer to each expose a portion of the oxide semiconducting layer, wherein the surface of the portion of the oxide semiconducting layer forming a primary bottom of the via;

step 5, removing the skin layer of the oxide semiconducting layer in the two vias to form two recesses respectively connecting with the two vias so as to eliminate the modified material property of the skin layer in the portion of the oxide semiconducting layer exposed through each of the vias, wherein the vias are extended, completely through the skin layer, by means of the recesses to reach into the body that exhibits the predetermined original material property such that the primary bottoms of the vias are each changed to a secondary bottom that is located in the body of the oxide semiconducting layer and is lower than the surface of the oxide semiconducting layer; and step 6, forming a source and a drain on the etching stopper layer, wherein the source fills one of the vias and the recess connecting therewith and has a portion embedded in the body of the oxide semiconducting layer at a location corresponding to the one of the vias to directly contact the body of the oxide semiconducting layer having the predetermined original material property, and the drain fills the other one of the vias and the recess connecting therewith and has a portion embedded in the body of the oxide semiconducting layer at a location corresponding to the other one of the vias to directly contact the body of the oxide semiconducting layer having the original predetermined material property;

wherein a first treating operation is carried out in step 4 to form the two vias in the etching stopper layer and a second treating operation that is separate from the first treating operation is carried out in step 5 to remove the skin layer of the oxide semiconductor in the two vias to form the two recesses, wherein the first treating operation is carried out first to form the two vias and the second treating operation is carried out chronically posterior to the first treating operation and is locally performed inside the two vias to remove the skin layer of the oxide semiconducting layer in the two vias to form the two recesses such that the source and the drain that fill in the vias and the recesses are partly located in the recesses to have lower ends of the source and the drain extend completely through the skin layer of the oxide semiconductor layer that has the modified material property to directly contact a portion of the body of the oxide semiconductor layer that exhibits the predetermined original material property.

2. The manufacturing method of the structure of the oxide thin film transistor according to claim 1, wherein the etching stopper layer is formed on the oxide semiconducting layer by chemical vapor deposition; the two vias are formed in the etching stopper layer by dry etching; the source and the drain are formed on the etching stopper layer by sputtering; the skin layer of the oxide semiconducting layer in the two vias are removed by dry etching or wet etching.

3. The manufacturing method of the structure of the oxide thin film transistor according to claim 1, wherein the etching stopper layer is a SiOx film layer formed by TEOS+02 or SiH4+N2O chemical vapor deposition.

4. The manufacturing method of the structure of the oxide thin film transistor according to claim 1, wherein the carrier comprises a substrate, a gate formed on the substrate and a gate isolated layer formed on the substrate and the gate.

5. The manufacturing method of the structure of the oxide thin film transistor according to claim 4, further comprising step 7 of performing a post process, wherein the post process comprises forming a protective layer on the source and the drain to cover the source and the drain.

6. The manufacturing method of the structure of the oxide thin film transistor according to claim 1, wherein the carrier is a substrate.

7. The manufacturing method of the structure of the oxide thin film transistor according to claim 6, further comprising a seventh step of performing a post process, and the post process comprises forming a protective layer on the source and the drain to cover the source and the drain.

* * * * *